(12) United States Patent
Prejbeanu et al.

(10) Patent No.: US 8,391,053 B2
(45) Date of Patent: Mar. 5, 2013

(54) MAGNETIC MEMORY WITH A THERMALLY ASSISTED WRITING PROCEDURE AND REDUCED WRITING FIELD

(75) Inventors: Ioan Lucian Prejbeanu, Sassenage (FR); Clarisse Ducruet, Grenoble (FR)

(73) Assignee: Crocus Technology SA, Grenoble Cedex (FR)

( * ) Notice: Subject to any disclaimer, the term of this patent is extended or adjusted under 35 U.S.C. 154(b) by 177 days.

(21) Appl. No.: 12/773,072

(22) Filed: May 4, 2010

(65) Prior Publication Data

US 2010/0284215 A1 Nov. 11, 2010

(30) Foreign Application Priority Data

May 8, 2009 (EP) .................................... 09290339

(51) Int. Cl.
*G11C 11/10* (2006.01)
*G11C 11/15* (2006.01)
(52) U.S. Cl. ........................................ 365/158; 365/171
(58) Field of Classification Search .................. 365/158, 365/171
See application file for complete search history.

(56) References Cited

U.S. PATENT DOCUMENTS

| | | | |
|---|---|---|---|
| 4,949,039 A | 8/1990 | Grunberg | |
| 5,159,513 A | 10/1992 | Dieny et al. | |
| 5,343,422 A | 8/1994 | Kung et al. | |
| 5,583,725 A | 12/1996 | Coffey et al. | |
| 5,640,343 A | 6/1997 | Gallagher et al. | |
| 5,959,880 A | 9/1999 | Shi et al. | |
| 6,603,677 B2 * | 8/2003 | Redon et al. | 365/158 |
| 6,950,335 B2 * | 9/2005 | Dieny et al. | 365/171 |
| 2005/0002228 A1 | 1/2005 | Dieny et al. | |
| 2006/0102971 A1 * | 5/2006 | Lee et al. | 257/421 |
| 2006/0291276 A1 * | 12/2006 | Nozieres et al. | 365/158 |
| 2008/0049488 A1 * | 2/2008 | Rizzo | 365/158 |
| 2008/0084724 A1 * | 4/2008 | Nozieres et al. | 365/50 |
| 2008/0164502 A1 | 7/2008 | Fukumoto et al. | |

OTHER PUBLICATIONS

Nakayama et al., Spin Transfer Switching in TbCoFe/CoFeB/MgO/CoFeB/TbCoFe Magnetic Tunnel Junctions with Perpendicular Magnetic Anisotropy, 2008, Journal of Applied Physics, 103.*
I.L. Prejbeanu, M Kerekes, R C Sousa, H Sibuet, O Redon, B Dieny, J P Nozieres; "Thermally Assisted MRAM", Journal of Physics: Condense Matter, IOP Publishing, J. Phys.: Condens, Matter 19 2007 165218, 23 pp.
European Search Report for EP09290339, dated Oct. 8, 2009.

* cited by examiner

*Primary Examiner* — Amir Zarabian
*Assistant Examiner* — Jay Radke
(74) *Attorney, Agent, or Firm* — Pearne & Gordon LLP

(57) ABSTRACT

A magnetic random access memory (MRAM) cell with a thermally assisted switching (TAS) writing procedure, comprising a magnetic tunnel junction formed from a ferromagnetic storage layer having a first magnetization adjustable at a high temperature threshold, a ferromagnetic reference layer having a fixed second magnetization direction, and an insulating layer, said insulating layer being disposed between the ferromagnetic storage and reference layers; a select transistor being electrically connected to said magnetic tunnel junction and controllable via a word line; a current line electrically connected to said magnetic tunnel junction; characterized in that the magnetocrystalline anisotropy of the ferromagnetic storage layer is essentially orthogonal with the magnetocrystalline anisotropy of the ferromagnetic reference layer. The TAS-MRAM cell of the invention can be written with a smaller magnetic field than the one used in conventional TAS-MRAM cells and has low power consumption.

10 Claims, 8 Drawing Sheets

MAGNETIC MEMORY WITH A THERMALLY ASSISTED WRITING PROCEDURE AND REDUCED WRITING FIELD

FIELD OF THE INVENTION

The present invention relates to the field of magnetic memories, especially non-volatile random-access magnetic memories used to store and read data in electronic systems. More particularly, it relates to Magnetic Random Access Memories, referred to as MRAM, based on magnetic tunnel junctions and an improvement of the fabrication process of the magnetic tunnel junction in order to reduce the power consumption.

DESCRIPTION OF RELATED ART

Magnetic random-access memories (MRAM) have been the object of a renewed interest with the discovery of magnetic tunnel junctions having a strong magnetoresistance at ambient temperature. These MRAM present many advantages such as speed (a few nanoseconds of duration of writing and reading), non volatility, and insensitivity to ionizing radiations. Consequently, they are increasingly replacing memory that uses more conventional technology based on the charge state of a capacitor (DRAM, SRAM, FLASH).

A conventional magnetic tunnel junction-based MRAM cell, called MRAM cell below, comprises a magnetic tunnel junction consisting of a stack of several alternatively magnetic and non-magnetic metallic layers. Examples of conventional MRAM devices are described in U.S. Pat. No. 5,640,343. In their simplest forms, the magnetic tunnel junctions of MRAM cells are made of two magnetic layers of different coercivity separated by a thin insulating layer where, for example, one of the magnetic layers is a ferromagnetic reference layer characterized by a fixed magnetization, and the other a ferromagnetic storage layer characterized by a magnetization which direction can be changed. When the respective magnetizations of the ferromagnetic reference and storage layers are antiparallel, the resistance of the magnetic tunnel junction is high, corresponding to a low logic state "0". On the other hand, when the respective magnetizations are parallel, the magnetic tunnel junction resistance becomes low, corresponding to a high logic state "1".

The ferromagnetic reference and storage layers are typically made of 3d metals such as Fe, Co or Ni or their alloys. Eventually, boron can be added in the layer composition in order obtain an amorphous morphology and a flat interface. The insulating layer typically consists of alumina ($Al_2O_3$) or magnesium oxide (MgO). Preferably, the ferromagnetic reference layer consists of several layers forming a synthetic antiferromagnetic layer, as described in U.S. Pat. No. 5,583,725. Alternatively, a double magnetic tunnel junction can be used, for example, as the one described in reference Y. Saito et al., Journal of Magnetism and Magnetic Materials Vol. 223 (2001), p. 293, where the ferromagnetic storage layer is sandwiched between two thin insulating layers with two ferromagnetic reference layers each located on an opposite side of the thin insulating layers.

A conventional MRAM cell 1 is represented in the example of FIG. 1. The cell 1 comprises a magnetic tunnel junction 2, formed from an insulating layer 22 disposed between a ferromagnetic reference layer 23 and a storage layer 21. A first current line 4 is in communication with the ferromagnetic storage layer 21, and a second current line 5 is placed orthogonal to the first current line 4, in communication with the ferromagnetic reference layer 23. The MRAM cell 1 further comprises a CMOS select transistor 3, electrically connected to the magnetic tunnel junction 2, and of which opening (turning on) and closing (turning off) is controlled by a word line 6 in order to address each MRAM cell 1 individually.

During a write operation, the transistor 3 is off and no current flows through the junction 2. A first field current 41 is passed through the first current line 4, generating a first magnetic field 42, and a second field current 51 is passed through the second current line 5, generating a second magnetic field 52. The intensity and synchronization of the first and second field currents 41, 51 are adjusted so that only the magnetization of the ferromagnetic storage layer 21, located at the intersection of the two active current lines 4, 5, can switch, to write data, under the combined effect of the first and second magnetic fields 42, 52, respectively. The first and second field currents 41, 51 are typically short current pulses from two to five nanoseconds having a magnitude on the order of 10 mA.

During a read operation, the transistor 3 is on allowing for a sense current (not shown) to flow through the magnetic tunnel junction 2 via the first current line 4, allowing for measuring the magnetic tunnel junction resistance R. The logic state of the MRAM cell 1 is typically determined by comparing the measured junction resistance R to the resistance of one or several reference memory cells (also not shown).

In order to ensure that the MRAM cell of FIG. 1 is working properly during the write operation, i.e., in order to obtain a bi-stable switching of the magnetization of the ferromagnetic storage layer 21, the magnetic tunnel junction 2 must have an anisotropic form, preferably with an aspect ratio of 1.5 or higher. The anisotropic form of the junction 2 allows for good writing selectivity of the MRAM cell 1 located at the intersection of the two active current lines 4, 5, compared to other cells 1 in an array, addressed by only one of the lines 4, 5. Indeed, the switching of the magnetization of the ferromagnetic storage layer 21 in the junction 2 with an anisotropic form is possible only under the influence of the two magnetic fields 42, 52, generated by the lines 4, 5. MRAM cells 1 having an anisotropic form also show good thermal and/or temporal stability of the written data.

Other exemplary configurations of conventional MRAM cells can be found in U.S. Pat. No. 4,949,039 and U.S. Pat. No. 5,159,513, while U.S. Pat. No. 5,343,422 is concerned with the implementation of a random-access memory (RAM) based on a MRAM cell structure.

U.S. Pat. No. 5,959,880 describes an MRAM cell having a small form aspect ratio, yet achieving well bi-stable switching during the write operation, and good thermal and/or temporal stability of the written data when the ferromagnetic storage layer is made of a material having high magnetocrystalline anisotropy. Writing such a MRAM cell, however, require high field currents able to switch the magnetization direction of the ferromagnetic storage layer from a stable logic state to another, resulting in high power consumption. A decrease in power consumption can be obtained by reducing the magnetocrystalline anisotropy but at the expense of thermal and temporal stability. In other words, the above conventional MRAM cells do not simultaneously fulfill low power consumption and thermal and temporal stability.

A MRAM cell configuration with a thermally assisted switching (TAS) writing procedure is described in document US2005002228 and represented in FIGS. 2a and 2b. In the example of FIG. 2a, the TAS-MRAM cell 10 differs from the MRAM cell 1 represented in FIG. 1 by having a current line 7, electrically connected to the magnetic tunnel junction 2, and a current line 8, placed above and perpendicular with the current line 7 in communication with the ferromagnetic storage layer 21.

The magnetic tunnel junction 2, represented in more details in FIG. 2b, comprises an antiferromagnetic reference layer 24, exchange biasing the adjacent ferromagnetic reference layer 23 in order to pin its magnetization when the temperature of the junction is below the blocking temperature $T_{BR}$ of the antiferromagnetic reference layer 24. The junction 2 also comprises an exchange coupling antiferromagnetic storage layer 21b, able to pin the magnetization of the adjacent ferromagnetic storage layer 21 when the temperature of the junction is below the blocking temperature $T_{BS}$ of the antiferromagnetic storage layer 21b. Typically, a blocking temperature $T_{BR}$ up to about 350° C. can be attained when the antiferromagnetic reference layer 24 is made of a PtMn or NiMn-based alloy, while a blocking temperature $T_{BS}$ of about 200° C. to 150° C. is achieved when the antiferromagnetic storage layer is made of an IrMn-based alloy or a FeMn-based alloy, respectively.

During a write operation of the TAS-MRAM cell 10, a heating current pulse 31 is sent through the magnetic tunnel junction 2 via the current line 7 when the select transistor 3 is on, in order to increase the temperature of the magnetic tunnel junction 2. Using a heating current 31 lasting several nanoseconds and having a magnitude between $10^5$ A/cm$^2$ and $10^7$ A/cm$^2$, the junction 2 can be heated to a temperature between 120° C. and 200° C., lying between $T_{BS}$ and $T_{BR}$. At such a temperature, the magnetic coupling between the ferromagnetic storage layer 21 and antiferromagnetic storage layer 21b disappears, unpinning the magnetization of the ferromagnetic storage layer 21. During the cooling of the magnetic tunnel junction 2 a field current 81 is passed in the current line 8, in order to generate a magnetic field 82 capable of reversing the magnetization direction of the ferromagnetic storage layer 21.

The TAS-MRAM cell 10 is typically fabricated by depositing the ferromagnetic reference and storage layers 23, 21 in the presence of an external magnetic field, applied with a collinear field direction. As illustrated in the example of FIG. 3, where the circles represent the magnetic tunnel junction 2 viewed from the top, the external magnetic field is applied with first and second field directions 110, 120 being parallel, here, pointing toward the right, during the deposition of the (a) ferromagnetic reference layer 23, and (b) ferromagnetic storage layer 21, respectively. After the deposition of the different layers of the magnetic tunnel junction 2, the latter is annealed at a temperature typically higher than 300° C. During the annealing step (c), the external magnetic field is applied with a third field direction 130 oriented parallel to the first and second field directions 110, 120. Such fabrication process yields a TAS-MRAM cell 10 having the magnetization of the unpinned ferromagnetic storage layer 21 to be parallel or antiparallel with the second magnetization of the ferromagnetic reference layer 23.

In contrast to the MRAM cell configuration of FIG. 1, the TAS-MRAM cell 10 of FIGS. 2a and 2b is characterized by a considerably improved thermal stability of the ferromagnetic storage layer 21, exchange biased by the antiferromagnetic storage layer 21b. An improved writing selectivity is also achieved due to the selective heating of the TAS-MRAM cell 10 to be written, in comparison with to the neighboring cells remaining at ambient temperature. The TAS-MRAM cell 10 allows for a better stability in a zero magnetic field (retention) by using materials with high magnetic anisotropy at ambient temperature, and a higher integration density without affecting its stability limit. Moreover, using the TAS-MRAM cell 10, reduced power consumption is achieved during the write operation since the heating current 31 required to heat the cell 10 and the field current 81 required to switch the magnetization of the ferromagnetic storage layer 21 are less than the first and second field currents 41, 51, used in the MRAM cell configuration of FIG. 1.

FIG. 4 represents a hysteresis loop corresponding to the TAS-MRAM cell 10 of FIG. 2a, where the magnetization M of the ferromagnetic storage layer 21 is plotted against the value H of magnetic field 82 applied along the easy axis of the ferromagnetic storage layer 21 (continuous line). Here, the coercive magnetic field $H_c$ corresponds to the field value required to reverse the magnetization of the ferromagnetic storage layer 21. The change in magnetization M with the applied magnetic field along the hard axis of the ferromagnetic storage layer 21 is shown by the dotted line in FIG. 3, where the anisotropy magnetic field $H_A$ corresponds to the field value needed to saturate the magnetization along the hard axis ferromagnetic storage layer 21. The value of the anisotropy magnetic field $H_A$ is generally larger than the coercive magnetic field $H_c$.

The coercive field $H_c$ is known to increase toward the anisotropy field $H_A$ when decreasing the cell size in the 100-nm size range and for short field current pulses 81, for example in the nanosecond range. In these conditions, the reversal of the magnetization of the ferromagnetic particles approaches a coherent reversal mechanism, also known as Stoner-Wohlfarth reversal, and the write current field is essentially given by the anisotropy field $H_A$.

The TAS-MRAM cell 10 thus suffers from increasing power consumption with reducing the size of the cell 10, for example, when increasing the cell density in an array. For small cell dimensions the field current 81 can still be high, yielding to high power consumption of the TAS-MRAM cell 10.

BRIEF SUMMARY OF THE INVENTION

An object of the invention is therefore to propose a magnetic random access memory (MRAM) cell with a thermally assisted switching (TAS) writing procedure which overcomes at least some limitations of the prior art.

Another object of the invention is to provide a TAS-MRAM cell that can be written with a smaller magnetic field than the one used in conventional TAS-MRAM cells.

According to the invention, these aims are achieved by means of a magnetic random access memory (MRAM) cell with a thermally assisted switching (TAS) writing procedure, comprising a magnetic tunnel junction formed from a ferromagnetic storage layer having a first magnetization adjustable at a high temperature threshold, a ferromagnetic reference layer having a fixed second magnetization direction, and an insulating layer, said insulating layer being disposed between the ferromagnetic storage and reference layers; a select transistor being electrically connected to said magnetic tunnel junction and controllable via a word line; a current line electrically connected to said magnetic tunnel junction; characterized in that the magnetocrystalline anisotropy of the ferromagnetic storage layer is essentially orthogonal to the magnetocrystalline anisotropy of the ferromagnetic reference layer.

In an embodiment of the invention, the cell further comprises a field line being in communication with said magnetic tunnel junction and passing at least a field current.

In another embodiment of the invention, the cell is writable by a heating current passing through the junction via the current line, the heating current being able to heat the magnetic tunnel junction to the high temperature threshold; and a field current passing in the field line, generating a magnetic field capable of aligning the first magnetization in accordance with the polarity of the field current.

In yet another embodiment of the invention, said magnetic tunnel junction further comprises an antiferromagnetic storage layer pinning said first magnetization of the ferromagnetic storage layer at a low temperature threshold, and unpinning said first magnetization at the high temperature threshold at which the first magnetization is aligned essentially orthogonal to the direction of the second magnetization.

In yet another embodiment of the invention, said magnetic tunnel junction further comprises an antiferromagnetic reference layer pinning the second magnetization of the ferromagnetic reference layer below a blocking temperature of the antiferromagnetic reference layer.

The present invention also encompasses a method of writing data in the TAS-MRAM cell, the method comprising the steps of:

passing the heating current through the magnetic tunnel junction via the current line to heat the magnetic tunnel junction;

passing the field current through the field line to switch the first magnetization of the ferromagnetic storage layer;

after the magnetic tunnel junction has reached the high temperature threshold, turning off the heating current to cool the magnetic tunnel junction, and after the magnetic tunnel junction has cooled down to a low temperature threshold, turning off the field current.

In an embodiment of the invention, said passing a field current switches the first magnetization from an orientation, essentially orthogonal to the direction of the second magnetization, to a switched direction, essentially parallel or antiparallel with the direction of the second magnetization.

The TAS-MRAM cell of the invention can be written using a magnetic field up to two times smaller than the magnetic field normally required with conventional TAS-MRAM cells, resulting in reduced power consumption. Since a small field current is used, possible electromigration in the field line is minimized.

In the present description of the invention, the expression "ferromagnetic reference layer" applies equally for a single ferromagnetic reference layer or for the first and second ferromagnetic reference layers of the synthetic antiferromagnetic pinned layer.

BRIEF DESCRIPTION OF THE DRAWINGS

The invention will be better understood with the aid of the description of an embodiment given by way of example and illustrated by the figures, in which.

DETAILED DESCRIPTION OF POSSIBLE EMBODIMENTS OF THE INVENTION

Figure 5A:
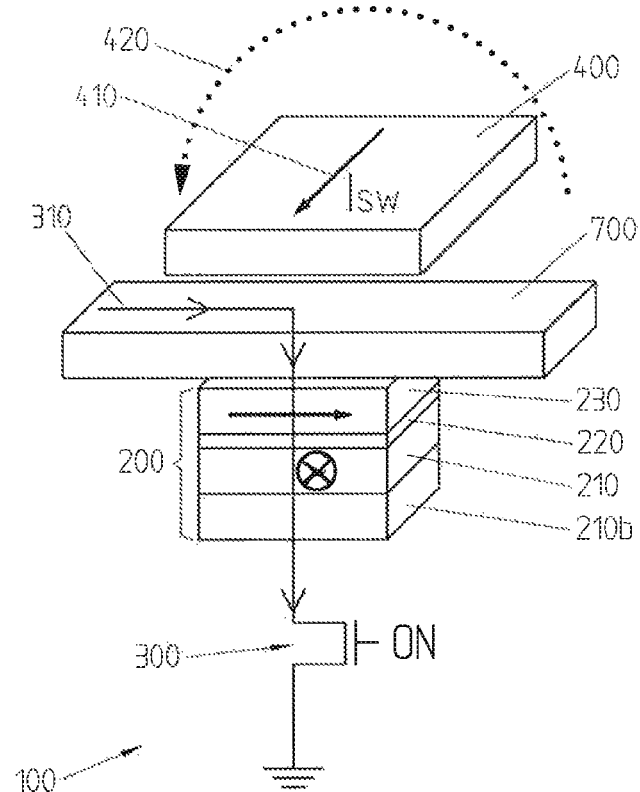
FIG. 5a illustrates a magnetic tunnel junction-based TAS-MRAM cell according to an embodiment of the invention during a write operation.
Figure 5B:
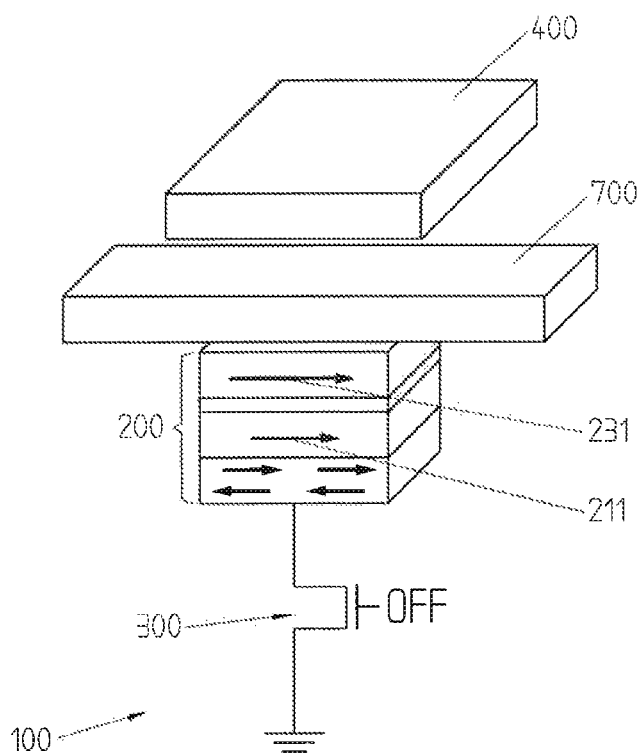
FIG. 5b illustrates the TAS-MRAM cell of FIG. 5a during a read operation.

A magnetic tunnel junction-based magnetic random access memory (MRAM) cell 100 with a thermally assisted switching (TAS) writing procedure according to an embodiment of the invention is shown in FIGS. 5a and 5b. Similarly to the cell 10 of FIG. 2a, the TAS-MRAM cell 100 of the invention comprises a multilayer magnetic tunnel junction 200 formed from an insulating layer 220 being disposed between a ferromagnetic storage layer 210, having a first magnetization 211, and a ferromagnetic reference layer 230, having a second magnetization 231. The magnetic tunnel junction 200 is in communication with a select transistor 300 controlled by a word line (not shown). The TAS-MRAM cell 1 further comprises a current line 700 electrically connected to the magnetic tunnel junction 200, and a field line 400 in communication with the ferromagnetic storage layer 210.

In an embodiment of the invention, the magnetic tunnel junction 200 comprises an antiferromagnetic reference layer (not shown in FIGS. 5a and 5b) exchange biasing the adjacent ferromagnetic reference layer 230 and pinning its second magnetization 231 when the temperature of the junction is below to the blocking temperature $T_{BR}$ of the antiferromagnetic reference layer. An antiferromagnetic storage layer 210b is also disposed adjacent to the ferromagnetic storage layer 210 (see FIGS. 5a and 5b), exchange biasing the ferromagnetic storage layer 210 and pinning its first magnetization 211 when the temperature of the junction is below the blocking temperature $T_{BS}$, lower than $T_{BR}$, of the antiferromagnetic storage layer 210b.

Preferably, the ferromagnetic reference layer 230 is formed of a Fe, Co or Ni-based alloy and the antiferromagnetic reference layer is formed of a Mn based alloy such as PtMn or NiMn. The ferromagnetic storage layer 210 has a thickness typically ranging from 1 to 10 nm, and is made of a material having a planar magnetization, preferably selected from the group Permalloy ($Ni_{80}Fe_{20}$), $Co_{90}Fe_{10}$ but also from other alloys containing Fe, Co or Ni. The ferromagnetic storage layer 210 is exchange-coupled by the antiferromagnetic storage layer 210b made of a manganese-based alloy, for example, of IrMn or FeMn.

In an embodiment of the invention not represented, the magnetic tunnel junction 200 comprises a synthetic antiferromagnetic pinned layer instead of the ferromagnetic reference layer 230. The synthetic antiferromagnetic pinned layer comprises a first ferromagnetic reference layer and a second ferromagnetic reference layer, both formed of a Fe, Co or Ni-based alloy. The two ferromagnetic reference layers are antiferromagnetically coupled by inserting between them a non-ferromagnetic reference layer made, for example, of ruthenium. In this configuration, the antiferromagnetic reference layer is provided, for example, below the second ferromagnetic reference layer, and orients the magnetic moment of the first ferromagnetic reference layer generating a pinning field that fixes the magnetic moment of the second ferromagnetic reference layer at a temperature below $T_{BR}$.

The antiferromagnetic storage layer 210b has a blocking temperature $T_{BS}$ sufficiently high to ensure that at standby temperature, i.e., in the absence of heating, magnetization of the ferromagnetic storage layer 210 is sufficiently pinned to be able to preserve its magnetization over a period of several years. The blocking temperature $T_{BS}$ is however not so high as to make it necessary to heat the junction 200, during the writing process, at a temperature that could yield to junction material degradation and/or high power consumption. Here, a $T_{BS}$ in the range of, for example, 120 to 220° C. is suitable.

The insulating layer 220, playing the role of a tunnel barrier, is preferably made of a material selected from the group comprising $Al_2O_3$ or MgO. The tunneling resistance R of the junction 200 depends exponentially on the thickness of the insulating layer 220 and is measured by the resistance-area product (RA) of the junction 200. The RA must BE sufficiently small in order to flow a heating current 310 through the junction 200 which is sufficiently high to raise the temperature of the antiferromagnetic storage layer 210b above its blocking temperature $T_{BS}$. In order to force a heating current density in the range of $10^5$ A/cm$^2$ to $10^7$ A/cm$^2$, typically required to raise the temperature of the junction up to 100° C., the RA value should be of the order of 1 to 500 $\Omega \cdot \mu m^2$.

In an embodiment of the invention, at least one thermal barrier layer (not shown) having a very low thermal conductivity is added at the top and at the bottom of the junction 200. The purpose of these additional layers is to increase the heating efficiency of the heating current 310 flowing through the junction 200 while limiting the diffusion of the heat towards the electrode (not shown), ensuring the electrical connection between the junction 200 and the connecting current line 700.

During a write operation of the TAS-MRAM cell 100, the heating current pulse 310 is sent through the magnetic tunnel junction 200 via the current line 700 when the select transistor 300 is on, in order to increase the temperature of the magnetic tunnel junction 200 at a high temperature threshold above $T_{BS}$ but below $T_{BR}$. At the high temperature threshold, which is represented in FIG. 5a, the magnetic coupling between the ferromagnetic storage layer 210 and antiferromagnetic storage layer 210b disappears, unpinning the first magnetization 211 of the ferromagnetic storage layer 210. At this temperature, however, the second magnetization 231 of the ferromagnetic reference layer 230 remains pinned by the antiferromagnetic reference layer.

In the TAS-MRAM cell 100 according to the invention as disclosed herein, the magnetocrystalline anisotropy of the ferromagnetic storage layer 210 is essentially orthogonal to the anisotropy of the antiferromagnetic layer 210b which pins the ferromagnetic storage layer 210, and to the magnetocrystalline anisotropy of the ferromagnetic reference layer 230. This implies that the first magnetization 211 of the ferromagnetic storage layer 210 is oriented essentially orthogonal to the direction of the second magnetization 231 of the reference layer 230, after the magnetic tunnel junction 200 has been heated to the high temperature threshold. In the example of FIG. 5a, the first magnetization direction 211 is represented entering the page while the second magnetization direction 231 is shown oriented toward the right. The first and second magnetizations 211, 231 could also be drawn outward the page and toward the left, respectively, or have any other directions as long as the first magnetization 211 is oriented essentially perpendicular to the second magnetization 231.

A field current 410 is then passed in the field line 400 in order to generate a magnetic field 420 capable of switching the first magnetization 211 to a switched orientation essentially parallel or antiparallel to the direction of the second magnetization 231 in accordance with the polarity of the field current 410. A datum is thus written into the memory cell 100. The heating current 310 is then turned off in order to cool the magnetic tunnel junction 200 to a low temperature threshold below the blocking temperature $T_{BS}$ of the antiferromagnetic storage layer 210b. The field current 410 is maintained until the magnetic tunnel junction 200 reaches the low temperature threshold and then turned off. At the low temperature threshold, the first magnetization 211 is pinned in the switched direction, parallel to the second magnetization 231 of the ferromagnetic reference layer 230 in the example of FIG. 5b.

Alternatively, the field current 410 can be passed immediately after the heating current 310 is turned off, but at a time where the temperature of the magnetic tunnel junction is above $T_{BS}$ in order to allow the first magnetization to be switched.

During a read operation (not represented), the transistor 300 is switched ON and a sense current is passed through the magnetic tunnel junction 200 via the current line 700, in order to measure a voltage across the junction 200, yielding the corresponding magnetic tunnel junction resistance R. A low junction resistance R is measured when the direction of the first magnetization 211 is parallel with the direction of the second magnetization 231 and, conversely, a high junction resistance R is measured when the directions of the first and second magnetization 211, 231 are antiparallel.

Figure 6:
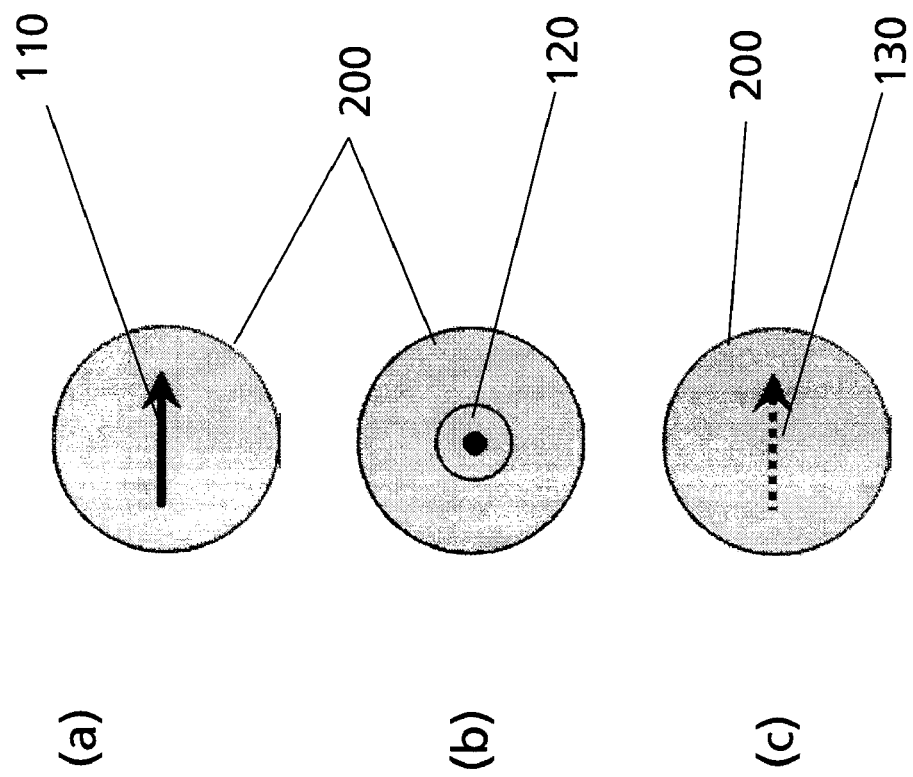
FIG. 6 shows the fabrication process of the magnetic tunnel junction of FIG. 5a, according to an embodiment of the invention.

The magnetocrystalline anisotropy of the ferromagnetic storage layer 210 essentially orthogonal to the magnetocrystalline anisotropy of the ferromagnetic reference layer 230 is obtained by depositing the ferromagnetic storage layer 210 in the presence of an external magnetic field applied with a field direction that is essentially orthogonal to the one of the external magnetic field applied during the deposition of the ferromagnetic reference layer 230. This is schematically illustrated in FIG. 6 where the circles represent the magnetic tunnel junction 200 viewed from the top. More particularly:

during the deposition process of the ferromagnetic reference layer 230 (FIG. 6a), the external magnetic field is applied with a first field direction 110 represented by the plain arrow; and during the deposition of the ferromagnetic storage layer 210 (FIG. 6b), the external magnetic field is applied with a second field direction 120, shown entering the page, essentially perpendicular to the first field direction 110.

After the deposition of the different layers of the magnetic tunnel junction 200, the latter is annealed at a temperature typically higher than 300° C. During the annealing step (FIG. 6c), the external magnetic field is applied with a third field direction 130, represented by the dashed arrow, oriented essentially parallel to the first field direction 110. Alternatively, the third field direction 130 can also be oriented antiparallel to the first field direction 110. Other orientations of the first, second and third field directions 110, 120, 130 are however possible in so far the second field direction 120 is oriented essentially perpendicular to the first and third field directions 110, 130

In an embodiment of the invention, the different layers of the magnetic tunnel junction 200 are deposited using a sputtering technique. Any other deposition process can however also be used.

In the case the synthetic antiferromagnetic pinned layer described above is used, the external magnetic field is applied with the first field direction 110 during both the deposition of the first and second ferromagnetic reference layers.

Figure 7:
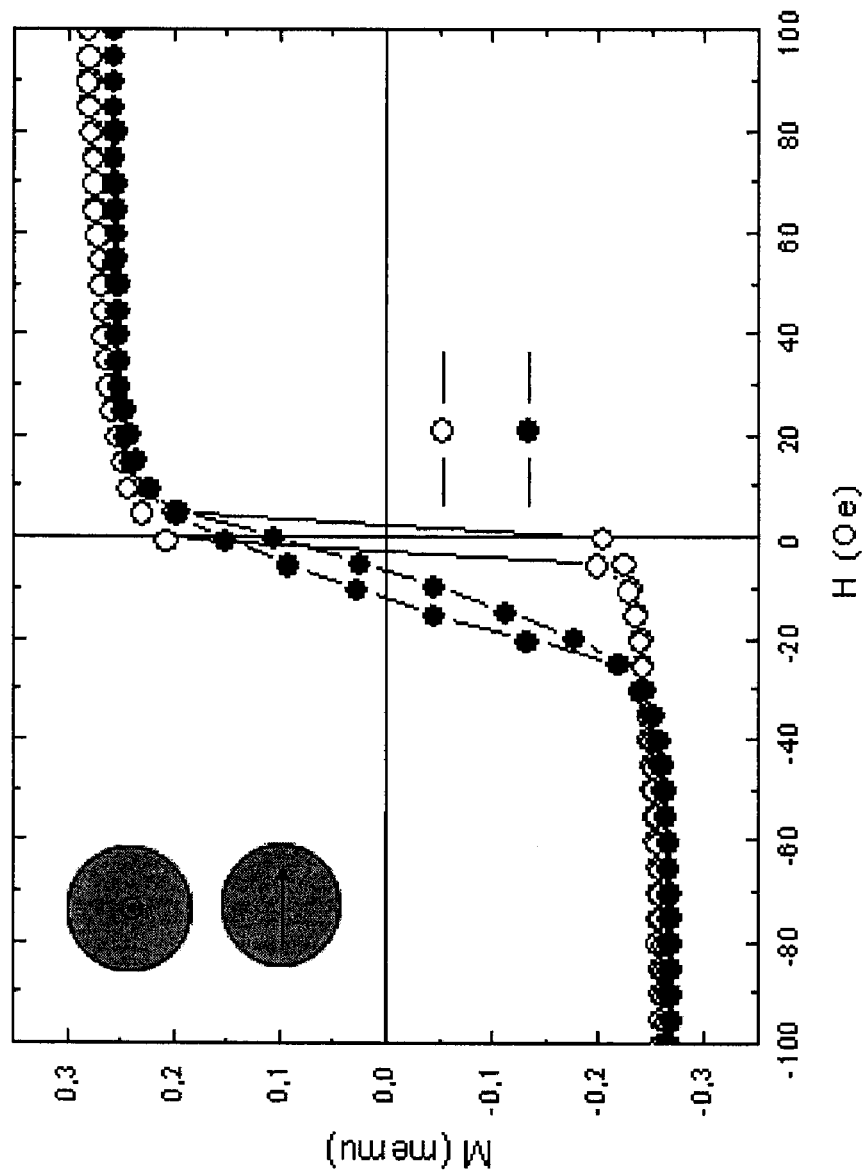
FIG. 7 shows a hysteresis loop measured for the TAS-MRAM cell of the invention.

FIG. 7 shows a hysteresis loop measured for the ferromagnetic storage layer 210 of the TAS-MRAM cell 100 of the invention having the first magnetization 211 essentially perpendicular with the second magnetization 231, at a temperature where the ferromagnetic storage layer 210 is not pinned. The inset shows the corresponding second and third field directions 120, 130. The magnetization M, plotted against the magnetic field H, is measured along the easy axis, parallel to the third field direction 130, of the ferromagnetic storage layer 210 (filled circles), and along the hard axis, perpendicular to the third field direction 130, of the ferromagnetic storage layer 210 (empty circles). Here, both the easy axis and hard axis are in the plane of the ferromagnetic storage layer 210. The magnetic field required to switch the first magnetization 211 of the ferromagnetic storage layer 210 is given by the difference in magnetic field values determined, respectively, at the onset of increasing magnetization and at the onset of saturation, on the hysteresis loop measured along the easy axis. Here, the first magnetization 211 is switched from its direction perpendicular to the direction of the second magnetization of the ferromagnetic reference layer 230 to the switched direction parallel or antiparallel to the second magnetization direction 230.

Figure 1:
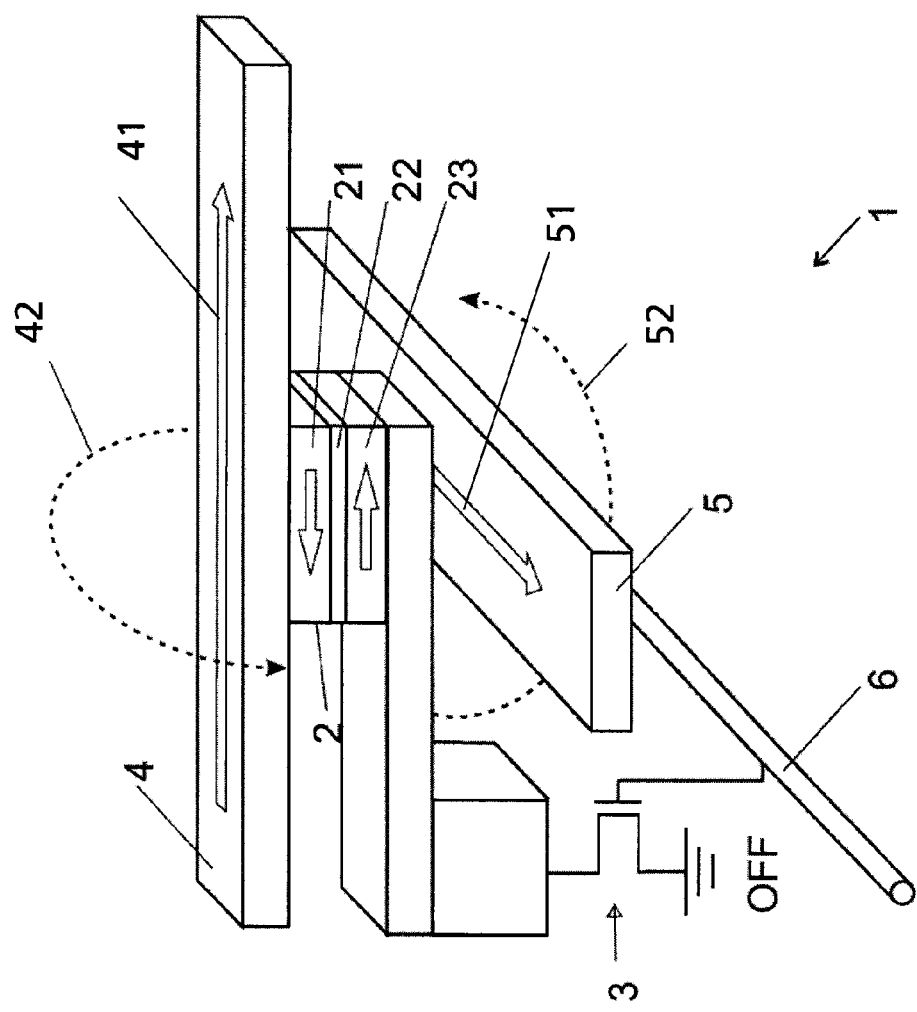
FIG. 1 shows a schematic view of a conventional magnetic tunnel junction-based magnetic random access memory (MRAM) cell.
Figure 2B:
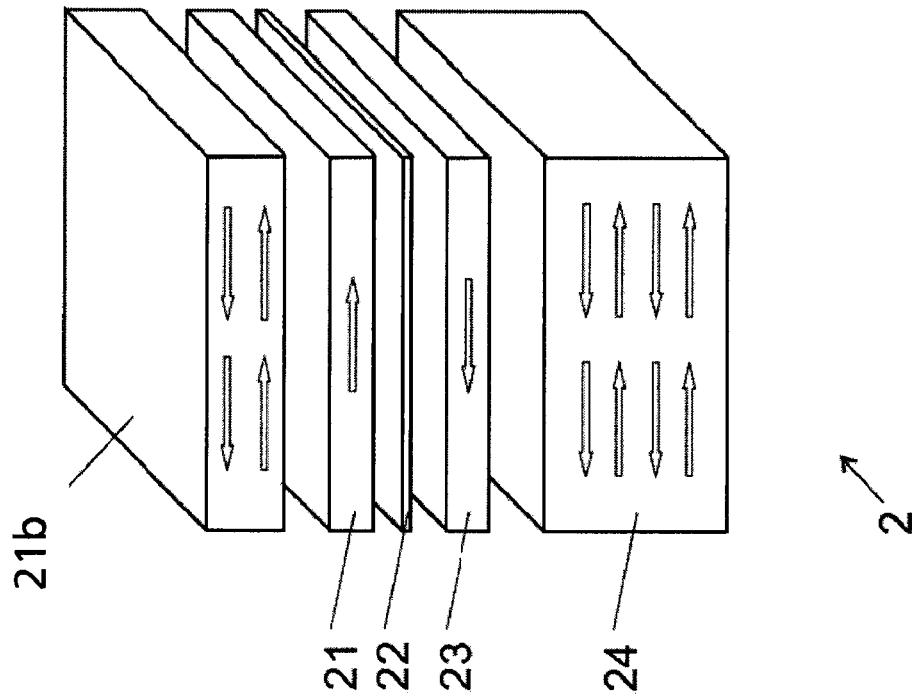
FIG. 2b represents the magnetic tunnel junction of the TAS-MRAM cell of FIG. 2a, the junction comprising a ferromagnetic storage layer.
Figure 2A:
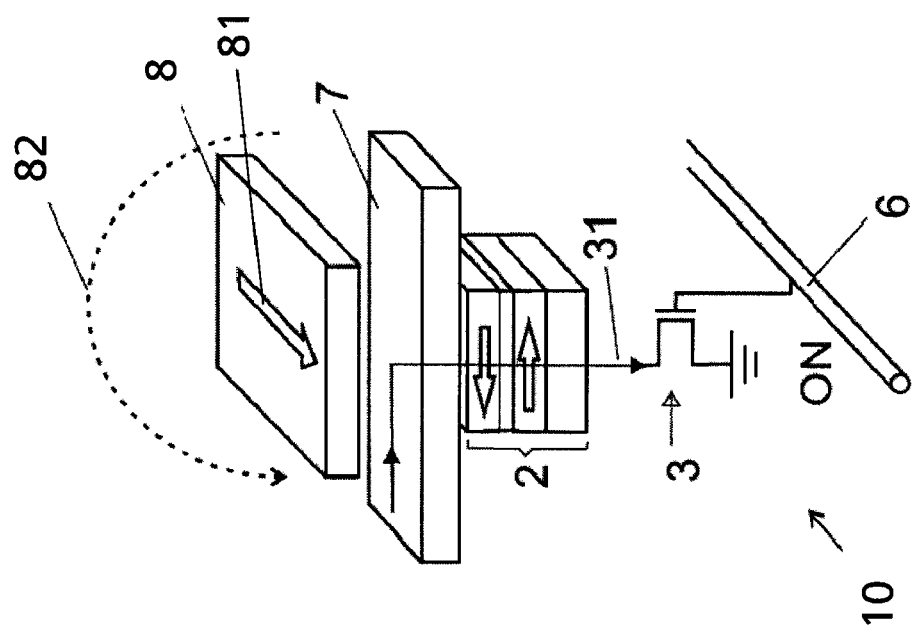
FIG. 2a represents a magnetic tunnel junction-based MRAM cell with a thermally assisted switching (TAS) writing procedure according to the prior art.
Figure 3:
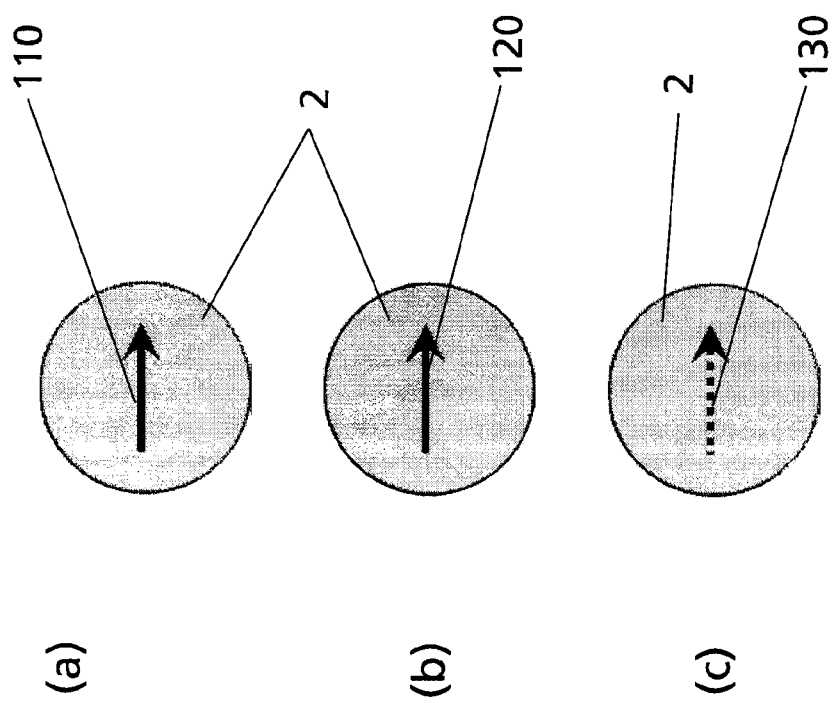
FIG. 3 represents schematically the fabrication process of the magnetic tunnel junction of FIG. 2b.
Figure 4:
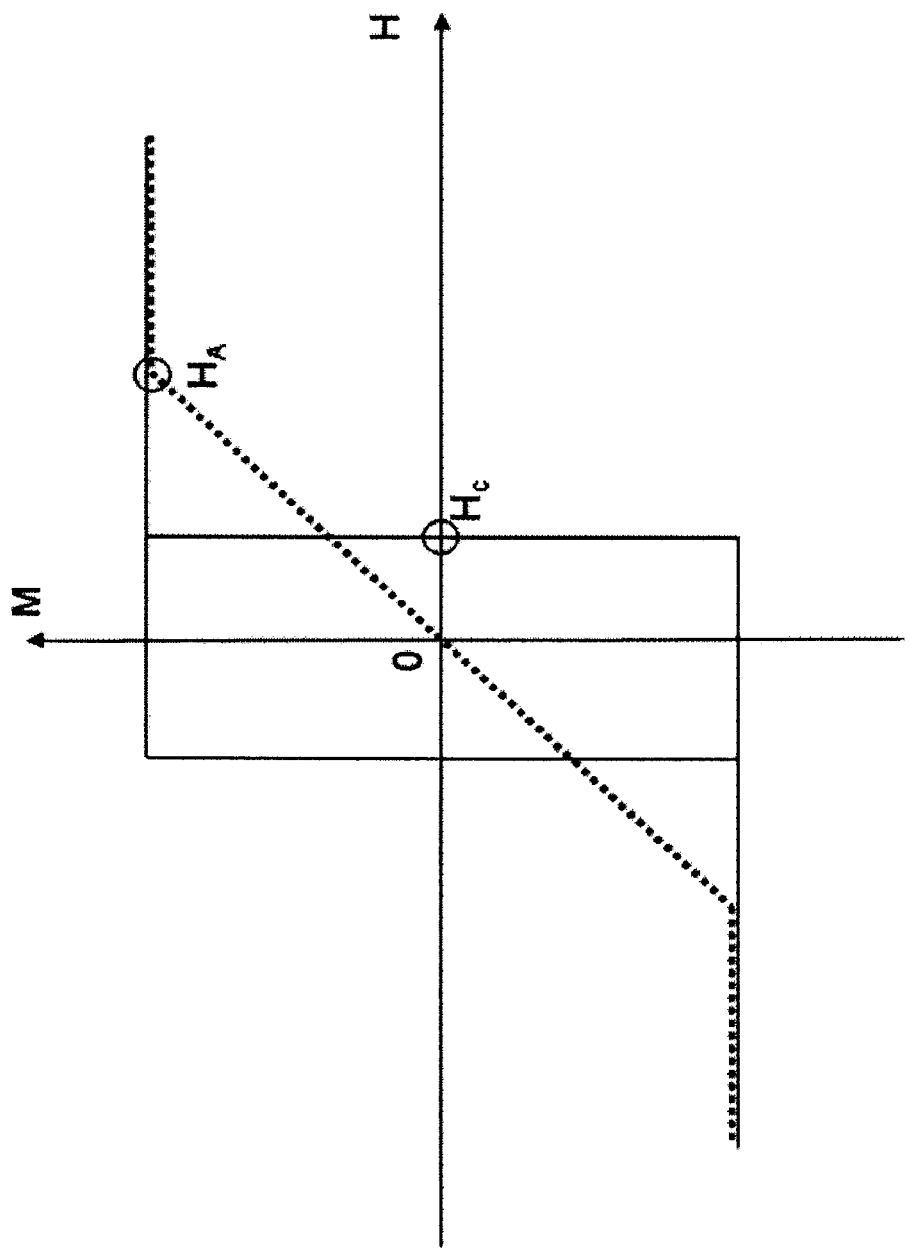
FIG. 4 represents a hysteresis loop along the easy and hard axis of the ferromagnetic storage layer comprised in the magnetic tunnel junction of FIG. 2b.
Figure 8:
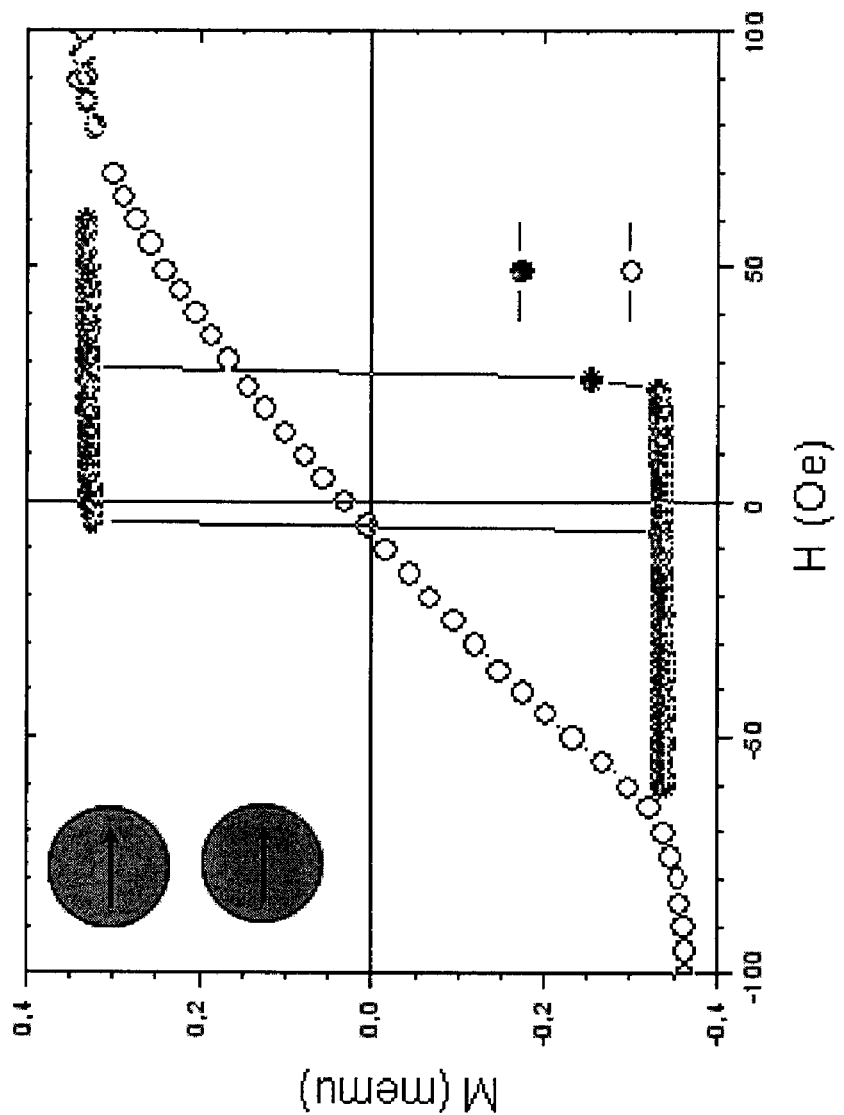
FIG. 8 shows a hysteresis loop measured for a conventional TAS-MRAM cell.

FIG. 8 represents a hysteresis loop measured for a conventional TAS-MRAM cell, such as the cell 10 of FIG. 2a. Here, the magnetization of the ferromagnetic storage layer 21 is parallel, or antiparallel, to the ferromagnetic reference layer 23, at a temperature where the ferromagnetic storage layer 21 is not pinned. The inset shows the corresponding second and third field directions 120, 130. In FIG. 8, the hysteresis loops measured along the easy and hard axis are shown with the filled circles and empty circles, respectively. The magnetic field H required to switch the magnetization M of the storage layer 21 of the conventional cell 10 from its initial direction to its switched direction, antiparallel or parallel to the magnetization direction of the ferromagnetic reference layer 23, is determined by the difference between the two values of the magnetic field H where the easy axis hysteresis loop crosses zero.

Comparing FIGS. 7 and 8 shows that the hysteresis loop measured along the easy axis of the ferromagnetic storage layer 210 of the TAS-MRAM cell 100 (FIG. 7) behaves similarly to the hysteresis loop measured along the hard axis of the ferromagnetic storage layer 21 of the conventional cell (FIG. 8). Conversely, the hysteresis loop measured along the hard axis of the ferromagnetic storage layer 210 in the case of the TAS-MRAM cell 100 (FIG. 7) behaves similarly the one measured along the easy axis of the ferromagnetic storage layer 21 for the conventional cell (FIG. 8). This suggests that the "easy" or "hard" character of the measured hysteresis loop is determined by the second field direction 120 of the external magnetic field applied during the deposition of the ferromagnetic storage layer 21, 210.

More importantly, the magnetic field, or anisotropy field, required to switch the first magnetization 211 of the TAS-MRAM cell 100, is about half the magnetic field necessary for switching the magnetization of the ferromagnetic storage layer 21 in the conventional TAS-MRAM cell 10 of FIG. 2a. The TAS-MRAM cell 100 according to any aspect of the invention, therefore, allows for a decrease in power consumption compared to the conventional TAS-MRAM cell since a lower field current 410 can be used to perform the write operation. Moreover, using a small field current 410 decreases possible risks of experiencing electromigration in the field line 400 and reaching electromigration limit, especially when the size of the TAS-MRAM cell 100 approaches the 100 nm range.

The TAS-based MRAM cell 100 with the magnetocrystalline anisotropy of the ferromagnetic storage layer 210 being essentially orthogonal to the magnetocrystalline anisotropy of the ferromagnetic reference layer 230 is advantageous in the case where the ferromagnetic storage layer 210 is exchange biased. Indeed, in the case the ferromagnetic storage layer 210 is not exchange biased the first magnetization 211 returns to its equilibrium state, essentially perpendicular to the second magnetization 231, during the reading operation. This results in a low read margin, since the magnetoresistance value corresponds to an intermediate value between the high resistance state and the low resistance state. In the case the ferromagnetic storage layer 210 is exchange biased, the first magnetization 211 remains parallel or antiparallel to the second magnetization during the read operation, yielding a maximal magnetoresistance value.

A magnetic memory device (not represented) can be formed from an array comprising a plurality of TAS-MRAM cells 100 according to any aspect of the invention, where each junction 200 of each TAS-MRAM cell 100 is connected on the side of the ferromagnetic storage layer 210 to the current line 700 and on the opposite side to the word line, placed perpendicular with the current line 700. When one of the TAS-MRAM cells 100 is to be written, a current pulse is sent in one or several word lines in order to put at least one of the transistors 300 of the corresponding word lines in mode ON, and a heating current pulse 310 is sent to each current lines 700 corresponding to the TAS-MRAM cells 100 to be written, i.e., the TAS-MRAM cells 100 placed at the intersection of the active connecting current lines 700 and active word lines.

REFERENCE NUMBERS 1 conventional MRAM cell
2 magnetic tunnel junction
21 ferromagnetic storage layer
21b antiferromagnetic storage layer
22 insulating layer
23 ferromagnetic reference layer
24 antiferromagnetic reference layer
3 select transistor
31 heating current
4 first field line
41 first field current
42 first magnetic field
5 second current line
51 second field current
52 second magnetic field
6 word line
7 current line
8 field line of conventional TAS-MRAM cell
81 field current
82 magnetic field
10 conventional TAS-MRAM cell
100 TAS-MRAM cell of the invention
110 first field direction
120 second field direction
130 third field direction
200 magnetic tunnel junction
210 ferromagnetic storage layer 210b antiferromagnetic storage layer
211 first magnetization of the ferromagnetic storage layer
220 insulating layer
230 ferromagnetic reference layer
231 second magnetization of the ferromagnetic reference layer
300 select transistor
310 heating current
400 field line
410 field current
420 magnetic field
700 current line

REFERENCE SYMBOLS $H_A$ anisotropy magnetic field
$H_C$ coercive magnetic field
$H_R$ reversal field of the ferromagnetic storage layer
$T_{BS}$ blocking temperature of the antiferromagnetic storage layer
$T_{BR}$ blocking temperature of the antiferromagnetic reference layer
M magnetization
R magnetic tunnel junction resistance resistance
R magnetoresistance
RA junction resistance-area product

The invention claimed is:

1. A magnetic random access memory (MRAM) cell with a thermally assisted switching (TAS) writing procedure, comprising:
    a magnetic tunnel junction formed from a ferromagnetic storage layer having a first magnetization adjustable at a high temperature threshold, an antiferromagnetic storage layer which pins the first magnetization of the ferromagnetic storage layer, a ferromagnetic reference layer having a fixed second magnetization direction, and an insulating layer, said insulating layer being disposed between the ferromagnetic storage and reference layers, wherein the magnetocrystalline anisotropy of the ferromagnetic storage layer is essentially orthogonal to the magnetocrystalline anisotropy of the ferromagnetic reference layer and the magnetocrystalline anisotropy of the antiferromagnetic storage layer such that the first magnetization is oriented substantially orthogonal to the direction of the second magnetization of the ferromagnetic reference layer when the magnetic tunnel junction is heated to the high temperature threshold;
    a select transistor being electrically connected to said magnetic tunnel junction and controllable via a word line; and
    a current line electrically connected to said magnetic tunnel junction.

2. The TAS-MRAM cell according to claim 1, wherein the cell further comprises a field line being in communication with said magnetic tunnel junction.

3. The TAS-MRAM cell according to claim 2, wherein the cell is writable by
    a heating current passing through the junction via the current line, the heating current being able to heat the magnetic tunnel junction at the high temperature threshold; and
    a field current passing in the field line generating a magnetic field capable of aligning the first magnetization in accordance with the polarity of the field current.

4. The TAS-MRAM cell according to claim 1, wherein said magnetic tunnel junction further comprises an antiferromagnetic reference layer pinning the second magnetization of the ferromagnetic reference layer below a blocking temperature of the antiferromagnetic reference layer.

5. The TAS-MRAM cell according to claim 1, wherein said magnetic tunnel junction comprises a synthetic antiferromagnetic pinned layer containing a first and second ferromagnetic reference layers antiferromagnetically coupled by inserting between them a non-ferromagnetic reference layer.

6. A magnetic memory device formed from an array comprising a plurality of TAS-MRAM cells comprising:
    a magnetic tunnel junction formed from
        a ferromagnetic storage layer having a first magnetization adjustable at a high temperature threshold;
        an antiferromagnetic storage layer that pins said first magnetization of the ferromagnetic storage layer;
        a ferromagnetic reference layer having a fixed second magnetization direction; and
        an insulating layer, said insulating layer being disposed between the ferromagnetic storage and reference layers,
        wherein the magnetocrystalline anisotropy of the ferromagnetic storage layer is essentially orthogonal to the magnetocrystalline anisotropy of the ferromagnetic reference layer and the magnetocrystalline anisotropy of the antiferromagnetic layer;
    a select transistor being electrically connected to said magnetic tunnel junction and controllable via a word line; and
    a current line electrically connected to said magnetic tunnel junction.

7. A method of writing data in a magnetic random access memory (MRAM) cell with a thermally assisted switching (TAS) writing procedure, wherein the TAS-MRAM cell comprising a magnetic tunnel junction formed from a storage layer having a first magnetization that is adjustable at a high temperature threshold, an antiferromagnetic layer which pins the first magnetization of the storage layer, a reference layer having a fixed second magnetization, and an insulating layer, said insulating layer being disposed between the storage and reference layers; the TAS-MRAM cell further comprising a select transistor being connected to said magnetic tunnel junction and controllable via a word line, a current line electrically connected to said magnetic tunnel junction and a field line in communication with the magnetic tunnel junction, and the magnetocrystalline anisotropy of the storage layer is essentially orthogonal to the magnetocrystalline anisotropy of the reference layer and the magnetocrystalline anisotropy of the antiferromagnetic layer, the method comprising the steps of:
    passing a heating current through the magnetic tunnel junction via the current line to heat the magnetic tunnel junction;
    passing a field current through the field line to switch the first magnetization of the storage layer;
    turning off the heating current to cool the magnetic tunnel junction after the magnetic tunnel junction has reached a high temperature threshold; and
    turning off the field current after the magnetic tunnel junction has cooled down to a low temperature threshold.

8. The method according to claim 7, wherein said passing a field current switches the first magnetization from an orientation, essentially orthogonal to the direction of the second magnetization, to a switched direction, essentially parallel or antiparallel with the direction of the second magnetization.

9. A method of manufacturing a magnetic random access memory (MRAM) cell with a thermally assisted switching (TAS) writing procedure, the TAS-MRAM cell comprising a magnetic tunnel junction formed from a storage layer having a first magnetization that is adjustable at a high temperature threshold, an antiferromagnetic layer which pins the first magnetization of the storage layer, a reference layer having a fixed second magnetization, and an insulating layer, said insulating layer being disposed between the storage and reference layers; wherein the magnetocrystalline anisotropy of the storage layer is essentially orthogonal to the magnetocrystalline anisotropy of the reference layer and the magnetocrystalline anisotropy of the antiferromagnetic layer; the method comprising the steps of:

depositing said reference layer with an applied external magnetic field having a first field direction;

depositing said storage layer with the applied external magnetic field having a second field direction, essentially perpendicular to said first field direction; and annealing said magnetic tunnel junction with the applied external magnetic field having a third field direction essentially parallel or antiparallel to the first field direction.

10. The TAS-MRAM cell according to claim 1, wherein the antiferromagnetic storage layer pins said first magnetization of the ferromagnetic storage layer at a low temperature threshold and unpins the first magnetization at the high temperature threshold.

* * * * *

UNITED STATES PATENT AND TRADEMARK OFFICE
CERTIFICATE OF CORRECTION

PATENT NO. : 8,391,053 B2
APPLICATION NO. : 12/773072
DATED : March 5, 2013
INVENTOR(S) : Ioan Lucian Prejbeanu et al.

It is certified that error appears in the above-identified patent and that said Letters Patent is hereby corrected as shown below:

In the specification, column 3, line 62, delete "with"

In the specification, column 6, line 37, delete "to"

In the claims, column 12, line 14, please add -- ; -- after "from"

Signed and Sealed this
Fourth Day of June, 2013

Teresa Stanek Rea
*Acting Director of the United States Patent and Trademark Office*